United States Patent [19]
Lin

[11] Patent Number: 6,165,895
[45] Date of Patent: Dec. 26, 2000

[54] FABRICATION METHOD OF AN INTERCONNECT

[75] Inventor: Jy-Hwang Lin, Kaohsiung, Taiwan

[73] Assignees: United Semiconductor Corp.; United Microelectronics Corp., both of Hsinchu, Taiwan

[21] Appl. No.: 09/344,865

[22] Filed: Jun. 28, 1999

[51] Int. Cl.[7] .............................................. H01L 21/4763
[52] U.S. Cl. ...................... 438/633; 438/636; 438/672; 438/637
[58] Field of Search ..................... 438/633, 622, 438/624, 629, 636, 637–640, 672–675, 685–688

[56] References Cited

U.S. PATENT DOCUMENTS

| | | | |
|---|---|---|---|
| 4,974,055 | 11/1990 | Haskell | 357/71 |
| 5,116,463 | 5/1992 | Lin et al. | 216/18 |
| 5,776,829 | 7/1998 | Homma et al. | 438/641 |

*Primary Examiner*—Charles Bowers
*Assistant Examiner*—Thanh Nguyen
*Attorney, Agent, or Firm*—Thomas, Kayden, Horstemeyer & Risley

[57] ABSTRACT

A method of fabricating an interconnect is described in which a conductive layer, an anti-reflection layer and a cover layer are sequentially formed on the substrate to form a conductive plug with its bottom situated in the anti-reflection layer. The cover layer and a portion of the anti-reflection layer and the conductive layer are remove to form an opening exposing the substrate and to define the conductive lining structures. A conformal polysilicon oxide layer is formed on the substrate and a first dielectric layer is also formed, filling the opening. A conformal isolation layer is then formed on the substrate, followed by forming a second dielectric layer covering the entire substrate. A planarization procedure is further conducted to expose the conductive plug.

13 Claims, 4 Drawing Sheets

FABRICATION METHOD OF AN INTERCONNECT

BACKGROUND OF THE INVENTION

1. Field of the Invention

The present invention relates to a fabrication method of an interconnect. More particularly, the present invention relates to a fabrication method of the interconnect of an unlanded via.

2. Description of the Related Art

The multilevel interconnects structure is widely employed in the current manufacturing design for integrated circuits. In order to reduce the distance between the conductive linings at the same level, connections between the conductive linings at various levels are being made by means of an unlanded via technique. Although reducing the distance between the conductive linings increases the integration of an integrated circuit, having adjacent conductive linings separated by a dielectric layer, however, results in the formation of an undesired parasitic capacitor. The parasitic capacitance on a microelectronic device contributes to effects such as an increase of the RC delay time and a decrease in the operational speed of the device.

To mitigate the problem of the decreased operational speed of the device resulting from the parasitic capacitance, the dielectric layer between the conductive lining structures is formed from a material having a low dielectric constant. In general, the most common material used for the dielectric layer between the conductive lining structures is hydrogen silsesquoxane (HSQ).

FIGS. 1A to 1B are schematic, cross-sectional views illustrating various stages of the fabrication of the interconnect according to the conventional approach.

As shown in FIG. 1A, conductive lining structures 102 and an anti-reflection layer 104 are formed on a substrate 100. A first dielectric layer 106 is also formed to fill the opening 108 between the conductive lining structures 102. Materials used for the first dielectric layer 106 include the low dielectric constant material, hydrogen silsesquoxane. An isolation layer 110 is further formed to cover the first dielectric layer 106, followed by forming a second dielectric layer 112 to cover the entire substrate 100. A photoresist layer 114 with a specific pattern is further formed on the second dielectric layer 112. Anisotropic etching is then conducted to remove the second dielectric layer 112 to form a via opening 116 and to partially expose the antireflection layer 104.

According to the above approach, if the photoresist layer 114 is formed without being completely aligned with the conductive lining structures 102, a portion of the isolation layer 110 and the first dielectric layer 106 will be etched away during the anisotropic etching process. The first dielectric layer 106 is thus exposed. Furthermore, the first dielectric layer 106 is a hydrogen silsesquoxane layer, whose etching rate is faster than that of the second dielectric layer 112. A wider hole 118 is thus formed between the conductive lining structures 102 while forming the via opening 116.

Referring to FIG. 1B, after removing the photoresist layer 114 (as shown in FIG. 1A), a barrier layer 120 is formed on the surfaces of the via opening 116, followed by filling the via opening 116 with a metal layer 122. Material used for the metal layer 122 includes tungsten, and for the barrier layer 120 includes titanium nitride.

According to the above approach, the low dielectric constant hydrogen silsesquoxane is exposed when the via opening is formed. Since hydrogen silsesquoxane is very hygroscopic, if water vapor penetrates into the first dielectric layer, the polarity of water will increase the dielectric constant of the first dielectric layer. Furthermore, when forming the metal layer, the temperature for the tungsten deposition is about 400° C. Under such a high temperature, the hydrated HSQ may exhibit out-gassing, which then hinders the metal layer from completely filling the via window and further leads to the occurrence of a poisoned via.

SUMMARY OF THE INVENTION

The current invention provides a fabrication method of an interconnect, which is effective in preventing the exposure of the low dielectric constant first dielectric layer when forming the via opening. A consequential poisoned via is thereby avoided.

The present invention provides a fabrication method of an interconnect in which a conductive layer, an anti-reflection layer and a cover layer are sequentially formed on the substrate. A portion of the cover layer and the anti-reflection layer is then removed to form a via opening with the bottom of the via opening situated in the anti-reflection layer. A barrier layer is further formed covering the bottom surface and the sidewalls of the via opening. A metal plug is also formed to fill the via opening. The barrier layer and the metal plug together form a conductive plug. After the cover layer is removed, a photoresist layer is formed to define the positions of the desired conductive lining structures. After which, using the photoresist layer and the conductive plug as etching masks, an anisotropic etching is conducted to partially remove the antireflection layer and the conductive layer to form an opening and conductive lining structures. A conformal polysilicon oxide layer is formed on the substrate, and a low dielectric constant first dielectric layer is further formed to fill the opening. A conformal isolation layer is then formed on the substrate covering the polysilicon oxide layer and the first dielectric layer, followed by forming a second dielectric layer to cover the entire substrate. A planarization procedure is further conducted to expose the conductive plug.

A salient feature of the present invention is the formation of a conductive plug before defining the conductive lining structures. As a result, even the opening between the conductive lining structures is filled with a low dielectric constant first dielectric layer, due to the formation of the conductive plug before the first dielectric layer, a misalignment which would lead to exposure of the first dielectric layer is prevented. A consequential increase in the dielectric constant and a poisoned via are thus further prevented.

Another advantage of forming the conductive plug before defining the conductive lining structure is that the conductive plug can function as an etching mask when using the photoresist layer to define the position of the conductive lining structures. Even if the pattern of the photoresist layer is formed without being completely aligned with the predetermined position of the conductive lining structure, a maximal contact area between the conductive plug and the conductive lining structure is still obtained. An optimal sheet resistance between the conductive plug and the conductive lining structure is thereby obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
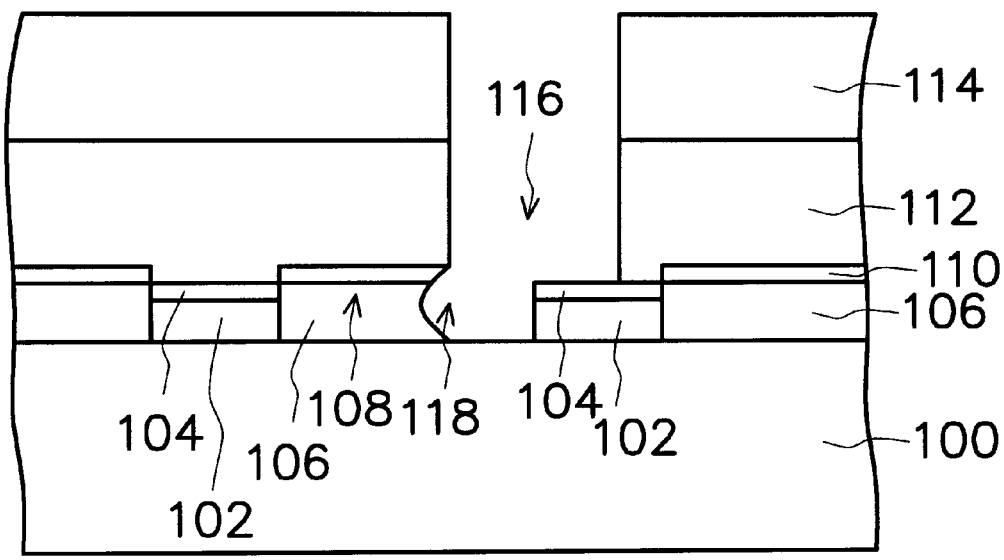
FIGS. 1A to 1B are schematic, cross-sectional views illustrating various stages of the fabrication of an interconnect according to the prior art.
Figure 1B:
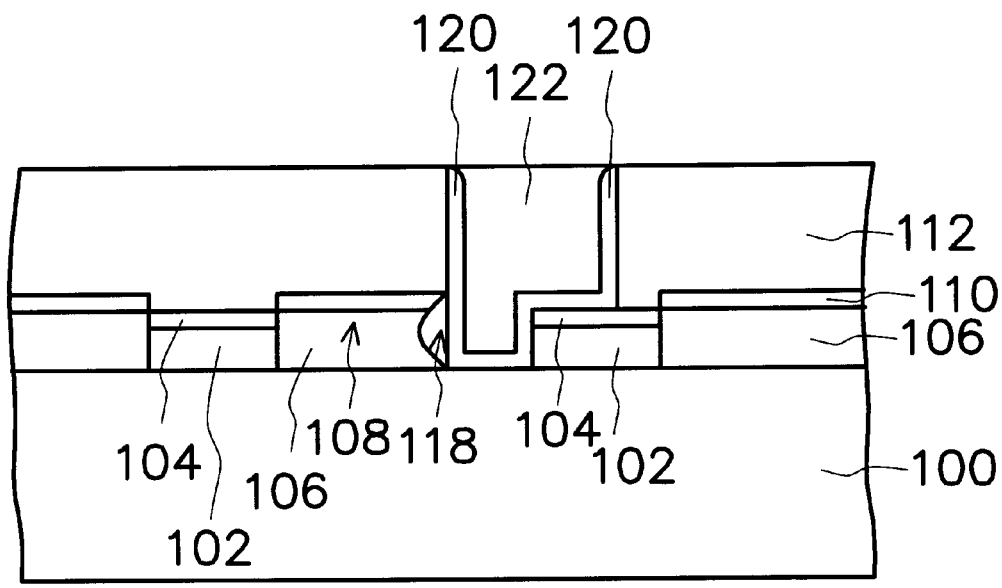
Figure 2A:
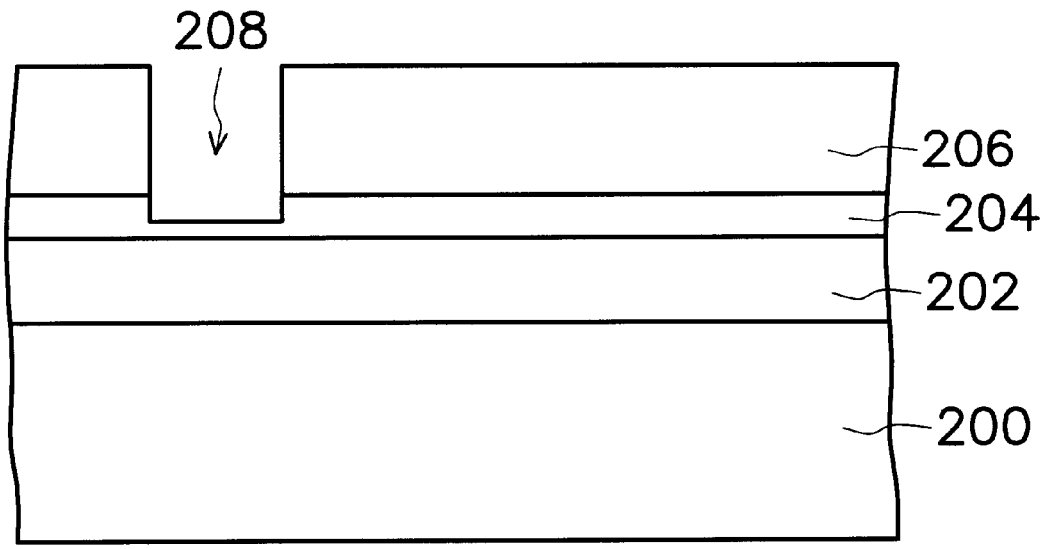
FIGS. 2A to 2F are schematic, cross-sectional views illustrating various stages of the fabrication of an interconnect according to the present invention.

Referring to FIG. 2A, a substrate 200 is provided. A conductive layer 202, an anti-reflection layer 204 and a cover layer 206 are sequentially formed on the substrate 200. Materials used for the conductive layer 202 include aluminum, for the anti-reflection layer 204 include titanium nitride (TiN) or technetium nitride (TaN), and for the cover layer 206 include plasma enhanced oxide (PEOX). A photolithography and etching operation is conducted to remove a portion of the cover layer 206 and the anti-reflection layer 204 to form a via opening 208. The bottom of the via opening 208 is situated in the anti-reflection layer 204.

Figure 2B:
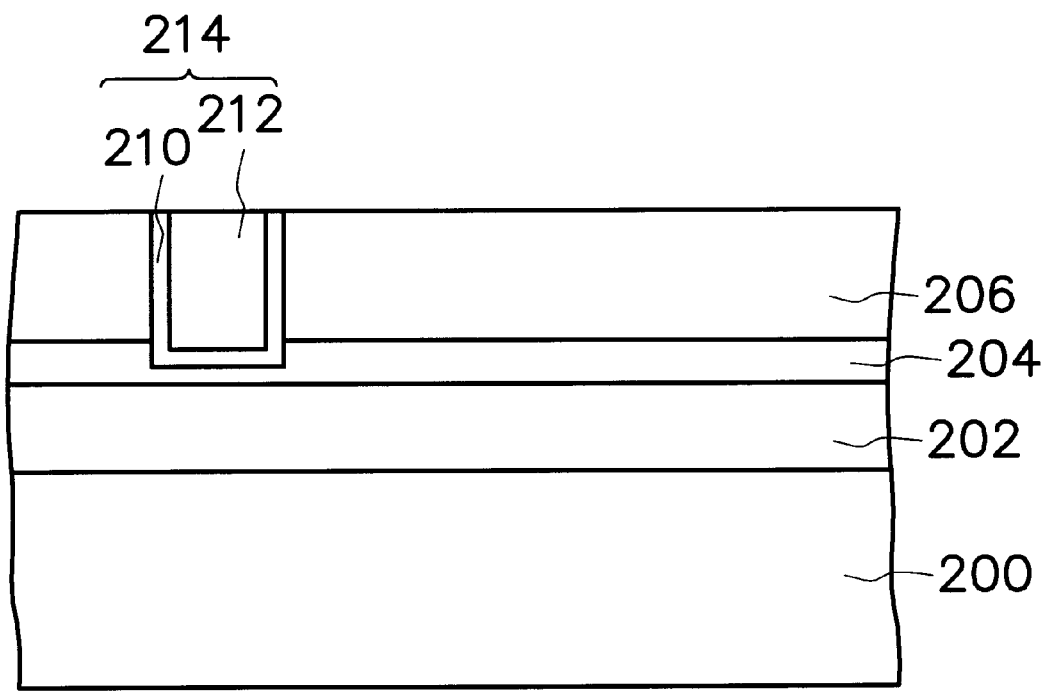

As shown in FIG. 2B, a barrier layer 210 is formed covering the surfaces of the via opening 208. A metal plug 212 is further formed to fill the via opening 208. The metal plug 212 and the barrier layer 210 together form a conductive plug 214. Materials used for the barrier layer 210 include titanium nitride, and for the metal plug 212 include tungsten. The metal plug 212 is formed by, for example, chemical vapor deposition (CVD) to form a metal layer (not shown in Figure) that covers the entire substrate 200 and fills the via opening 208. A planarization procedure, for example chemical mechanical polishing (CMP), is further conducted to remove the metal layer other than the part filling the via opening 208.

Figure 2C:
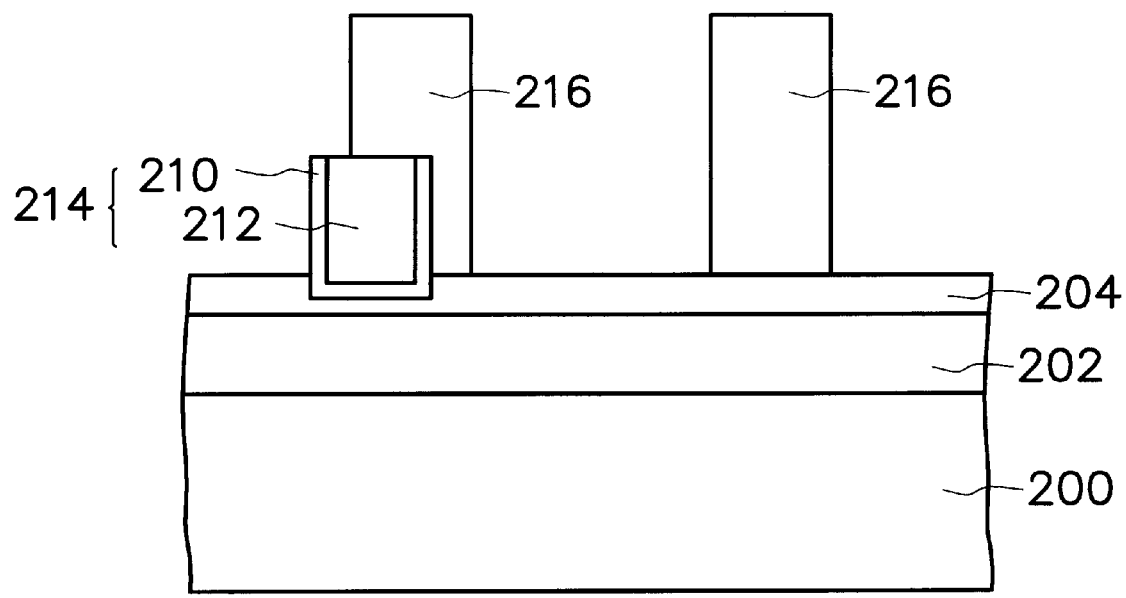
Figure 2D:
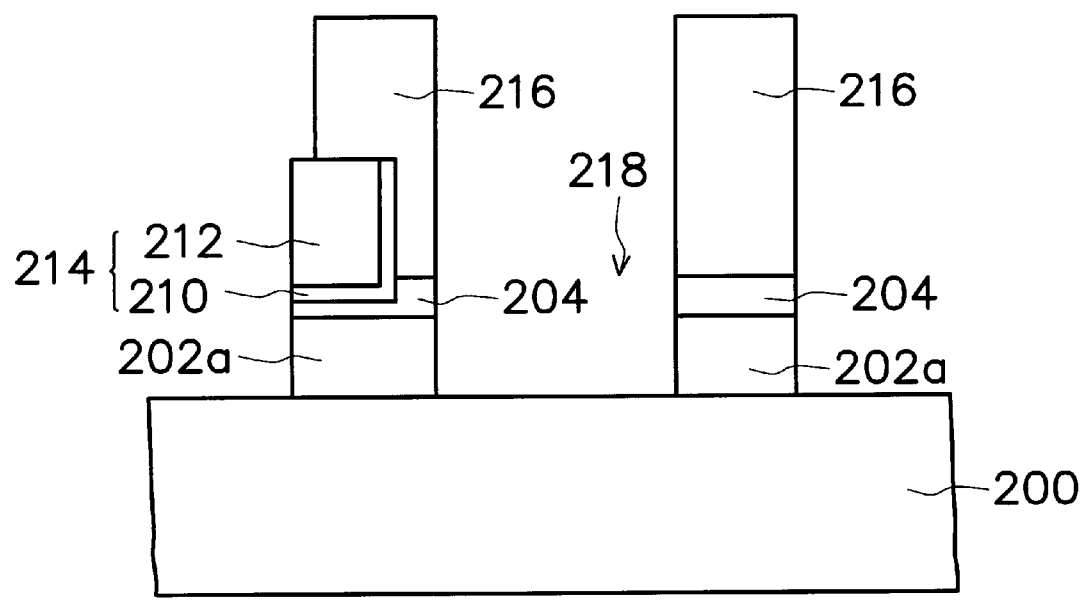

As shown in FIG. 2C, the cover layer 206 is removed, and a photoresist layer 216 with a specific pattern is formed on the anti-reflection layer 204 and the conductive plug 214 to define the positions for the conductive lining structures 202a (as shown in FIG. 2D). If any misalignment occurs during the formation of the photoresist layer 216, a portion of the conductive plug 212 may be exposed.

As shown in FIG. 2D, portions of the anti-reflection layer 204 and the conductive layer 202 are removed to form an opening 218 exposing the substrate and to simultaneously form the conductive structures 202a. The step of forming the opening 218 and the conductive structures 202a includes anisotropic etching, with the photoresist layer 216 serving as a mask. Since the etching ratios for the metal plug 212 and the conductive layer 202 are different, the metal plug 212 can be used as a hard mask during the etching even if the metal plug 212 is not completely covered by the photoresist layer 216. The bottom of the metal plug 212 is thus completely in contact with the conductive lining structure 202a. The contact area between the metal plug 212 and the conductive lining structure 202 is thereby not diminished due to a misalignment.

Figure 2E:
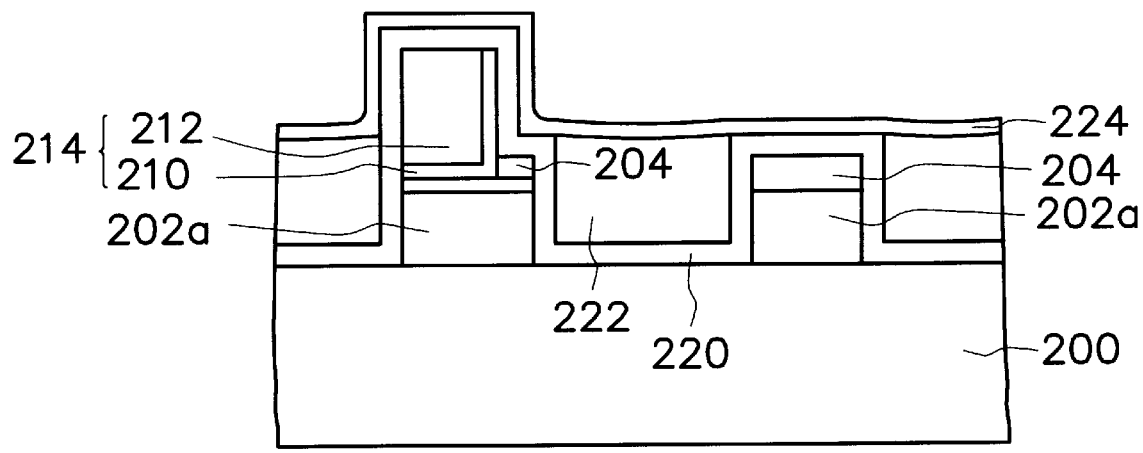

Referring to FIG. 2E, the photoresist layer 216 (as shown in FIG. 2D) is removed and a conformal polysilicon oxide layer 220 is formed on the substrate 200. A first dielectric layer 222 is then formed, filling the opening 218, followed by forming a conformal isolation layer 224 on the substrate 200. The purpose of the low dielectric constant first dielectric layer 222 is to isolate the conductive lining structure. The first dielectric layer 222 includes hydrogen silsesquoxane. The purpose of the isolation layer 224 is to isolate the first dielectric layer 222 in order to prevent water absorption by the first dielectric layer 222. Materials used for the isolation layer 224 include a doped oxide.

Figure 2F:
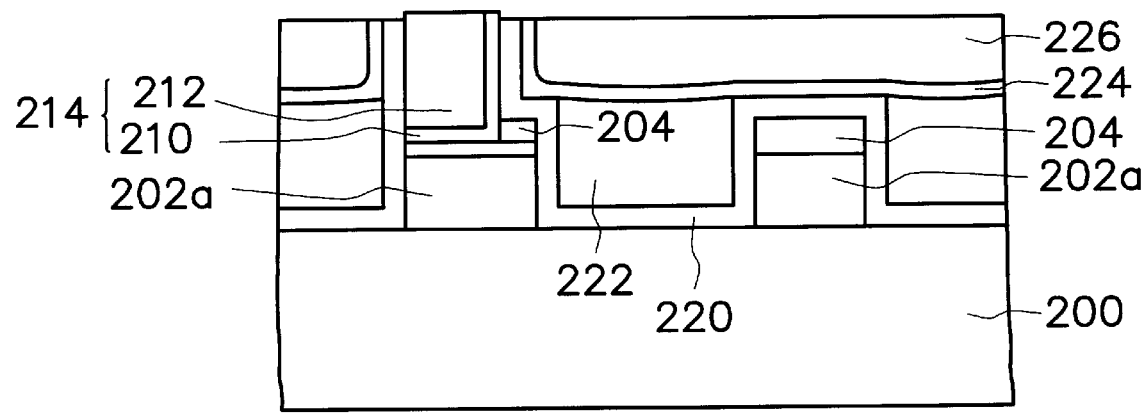

As shown in FIG. 2F, a second dielectric layer 226 is formed covering the substrate 200. A planarization procedure is then conducted on the second dielectric layer 226 to expose the conductive plug 214. The second dielectric layer 226 is formed by methods including plasma enhanced deposition. The planarization procedure, such as chemical mechanical polishing, is conducted until the second dielectric layer 226 is the same height as the top surface of the conductive plug 214.

A special feature of the present invention is the formation of a conductive plug before the conductive lining structures are defined. As a result, even the opening between the conductive lining structures is filled with a low dielectric constant first dielectric layer, due to the formation of the conductive plug before the first dielectric layer, a misalignment which would lead to exposure of the first dielectric layer is prevented. A consequential increase in the dielectric constant and a poisoned via are thus further prevented.

Another advantage of forming the conductive plug before defining the conductive lining structures is to use the conductive plug as an etching mask when the photoresist layer is used to define the positions of the conductive lining structures. Even if the pattern of the photoresist layer is formed without being completely aligned with the predetermined positions of the conductive lining structures, a maximal contact area between the conductive plug and the conductive lining structure is still obtained. An optimal sheet resistance between the conductive plug and the conductive ling structure is thereby obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of an interconnect comprising the steps of:

providing a substrate with a conductive layer, an anti-reflection layer and a cover layer sequentially formed on the substrate;

removing a portion of the cover layer and the anti-reflection layer to form a via opening;

forming a conductive plug in the via opening;

removing the cover layer;

forming a photoresist layer with a specific pattern on the conductive plug and the anti-reflection layer;

conducting anisotropic etching to form an opening and a conductive lining structures, with the photoresist layer and the conductive plug serving as etching masks;

removing the photoresist layer;

forming a first dielectric layer to fill the opening;

forming a conformal isolation layer on the substrate; and conducting a planarization procedure to expose the conductive plug.

2. The fabrication method of an interconnect according to claim 1, wherein the first dielectric layer comprises hydrogen silsesquoxane.

3. The fabrication method of an interconnect according to claim 1, wherein the conductive plug comprises a barrier layer and a metal plug.

4. The fabrication method of an interconnect according to claim 1, wherein the metal plug comprises tungsten.

5. The fabrication method of an interconnect according to claim 1, wherein the barrier layer comprises titanium nitride.

6. The fabrication method of an interconnect according to claim 1, wherein the isolation layer comprises doped oxide.

7. The fabrication method of an interconnect according to claim 1, wherein the planarization procedure, including chemical mechanical polishing, is conducted until the conductive plug is exposed.

8. The fabrication method of an interconnect according to claim 1, wherein the bottom of the via opening is located in the anti-reflection layer.

9. The fabrication method of an interconnect according to claim 1, wherein the conductive lining structure comprises aluminum.

10. A fabrication method of an interconnect comprising the steps of:

providing a substrate with a conductive layer and an anti-reflection layer formed on the substrate;

forming a conductive plug on the substrate with the bottom of the conductive plug situated in the anti-reflection layer;

forming a photoresist layer with a specific pattern on the conductive plug and the anti-reflection layer;

conducting anisotropic etching to form an opening and a conductive lining structure, with the photoresist layer and the conductive plug serving as etching masks; and removing the photoresist layer.

11. The fabrication method of an interconnect according to claim 10, wherein the conductive plug comprises a barrier layer and a metal plug.

12. The fabrication method of an interconnect according to claim 10, wherein the metal plug comprises tungsten.

13. The fabrication method of an interconnect according to claim 10, wherein the conductive lining structure comprises aluminum.

* * * * *